United States Patent
Elkington et al.

(10) Patent No.: US 6,571,324 B1
(45) Date of Patent: May 27, 2003

(54) WARMSWAP OF FAILED MEMORY MODULES AND DATA RECONSTRUCTION IN A MIRRORED WRITEBACK CACHE SYSTEM

(75) Inventors: Susan G. Elkington, Colorado Springs, CO (US); Stephen J. Sicola, Monument, CO (US); Wayne H. Umland, Colorado Springs, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 08/883,381

(22) Filed: Jun. 26, 1997

(51) Int. Cl.[7] .................................................. G06F 12/08
(52) U.S. Cl. ........................ 711/162; 711/120; 711/143; 714/6
(58) Field of Search ................................ 711/120, 143, 711/142, 161, 162, 165, 119; 714/6, 7, 8, 2, 12, 15

(56) References Cited

U.S. PATENT DOCUMENTS

| | | | | |
|---|---|---|---|---|
| 5,051,887 A | * | 9/1991 | Berger et al. ................ 711/162 |
| 5,390,187 A | * | 2/1995 | Stallmo ......................... 714/7 |
| 5,544,347 A | * | 8/1996 | Yanai et al. .................. 711/162 |
| 5,553,231 A | * | 9/1996 | Papenberg et al. ............. 714/5 |
| 5,588,110 A | * | 12/1996 | DeKoning et al. ............. 714/5 |
| 5,615,329 A | * | 3/1997 | Kern et al. ..................... 714/6 |
| 5,632,013 A | * | 5/1997 | Krygowski et al. ............ 714/7 |
| 5,692,155 A | * | 11/1997 | Iskiyan et al. ............... 711/162 |
| 5,742,792 A | * | 4/1998 | Yanai et al. ................. 711/161 |
| 5,761,705 A | * | 6/1998 | DeKoning et al. .......... 711/113 |
| 5,802,561 A | * | 9/1998 | Fava et al. ................... 711/120 |
| 5,864,657 A | * | 1/1999 | Stiffler .......................... 714/15 |
| 5,913,927 A | * | 6/1999 | Nagaraj et al. ................. 714/8 |
| 5,917,723 A | * | 6/1999 | Binford ........................ 700/11 |
| 6,108,684 A | * | 8/2000 | DeKoning et al. .......... 709/105 |
| 6,199,074 B1 | * | 3/2001 | Kern et al. .................. 707/204 |

FOREIGN PATENT DOCUMENTS

EP 0 800 138 A1 * 8/1997 ........... G06F/12/08

* cited by examiner

Primary Examiner—Matthew Kim
Assistant Examiner—Pierre-Michel Bataille
(74) Attorney, Agent, or Firm—William J. Kubida; Stuart T. Langley; Hogan & Hartson LLP

(57) ABSTRACT

A warmswap operation to replace modules in a mirrored cache system has been accomplished by disabling mirrored write operations in the cache system; testing the replacement memory module in the cache system; and restoring the mirrored data in the cache system. The restoring operation is accomplished by first quiescing write operations to stop writing data in the cache system not backed up in non-volatile data storage. Then data is copied from surviving memory modules to the replacement module, and the cooperative interaction of the surviving memory modules with the replacement memory module is validated. The validating operation verifies the cache modules are ready and the controllers are synchronized. After validation the quiesced write operations are un-quiesced, and mirrored-write operations for the cache system are enabled.

11 Claims, 3 Drawing Sheets

WARMSWAP OF FAILED MEMORY MODULES AND DATA RECONSTRUCTION IN A MIRRORED WRITEBACK CACHE SYSTEM

CROSS REFERENCE TO RELATED APPLICATIONS

The following copending, commonly-assigned patent applications describe a mirrored write-back cache system used with the present invention and are hereby incorporated by reference.

1. "Simultaneous Mirror Write Cache" invented by Tom Fava et al, U.S. patent application Ser. No. 08/671,154 filed Jun. 28, 1996, now U.S. Pat. No. 5,802,561.

2. "Enabling Mirror, Non-Mirror and Partial Mirror Cache Modes In a Dual Cache Memory" invented by Susan Elkington et al, U.S. patent application Ser. No. 08/671,153 filed Jun. 28, 1996, now U.S. Pat. No. 5,974,506.

3. "Controls For Dual Controller Dual Cache Memory System invented by Clark Lubber et al, U.S. patent application Ser. No. 08/668,512 filed Jun. 28, 1996, now U.S. Pat. No. 6,279,078.

BACKGROUND OF THE INVENTION

1. Field of the Invention

This invention relates to warmswap of cache modules in a mirrored cache system. More particularly, the invention relates to replacing memory modules while continuing to operate the mirrored cache system.

2. Description of the Related Art

For some time now, storage systems have been designed to remain in operation during the repair of single module failures in the storage system. In some peripheral storage systems, the system has been designed to permit a hotswap where, for example, a disk drive may be pulled and replaced with no preparatory operations by the storage system. In memory storage systems, more typically a warmswap procedure is followed. In a warmswap, the storage system remains operative during replacement of a module, but a predetermined procedure is invoked to prepare the storage system for replacement of the module. In effect, the storage system is quiesced (placed in a lower state of operative capacity), the failed module is replaced, and the storage system is brought back up to full operative capacity.

With the advent of mirrored cache systems, and particularly mirrored write-back cache systems, a new set of problems was created for maintaining operation of the cache storage system while replacing a component or module in the system. In mirrored cache systems, the data in cache is duplicated in separate memory modules. Thus, it should be possible to replace one memory module with little, or no, degradation of performance of the cache memory access time. However, the difficulty arises in protecting data in the good memory module while swapping the bad memory module. Further, once the bad memory module is replaced, the new memory module must be brought back up to the same level of data integrity as the good memory module to effectively heal the mirrored cache system.

SUMMARY OF THE INVENTION

In accordance with this invention, the above problems in replacing modules in a mirrored cache system have been accomplished by disabling mirrored write operations in the cache system; testing the replacement memory module in the cache system; and restoring the mirrored data in the cache system. The restoring operation is accomplished by first quiescing write operations to stop writing data in the cache system not backed up in non-volatile data storage. Then data is copied from surviving memory modules to the replacement module, and the cooperative interaction of the surviving memory modules with the replacement memory module is validated. The validating operation verifies the cache modules are ready and the controllers are synchronized. After validation the quiesced write operations are un-quiesced, and mirrored-write operations for the cache system are enabled.

As a further feature of the invention during recovery of the cache system write-back are disabled by switching the write operations to the cache system from write-back operations to write-through operations where all cache write operations are also written to non-volatile storage.

In another embodiment of the invention the cache system has two cache modules and two controllers, each cache module has two quadrants of storage space so that a mirrored write operation writes the same data to one quadrant in one cache module and a paired quadrant in the other cache module. The method of recovering the cache system begins by disabling the mirrored write operations and enabling writing to only the good cache. The failed cache module is replaced with a new cache module while continuing to write to the remaining good cache module. The new cache module is tested in the cache system, and the mirrored write operations is restored to both the remaining good cache module and the new cache module. The write-back operations are disabled and write-through operations are enabled during recovery of the system. RAID write operations are quiesced to prevent writing data to the cache system that is not backed-up in non-volatile storage. The metadata from both quadrants in the good cache module is copied to the assigned paired quadrants in the new cache module. After verification that all quadrants are operating correctly and the controllers are synchronized, the write-back and RAID write operations are enabled, and mirrored-write operations to the restored cache system are enabled.

As another feature of the invention, data copying from a good cache module to the new cache module, the releasing of quiesced write operations and the enabling of mirrored-write operations are all performed sequentially for each volume of data in the good module.

The great advantage and utility of the present invention is the extraordinary reliability of a cache system in which the invention is used. If the cache system continues to operate in write-back mode, while the system is being recovered, the change in performance of the system during replacement of the module is barely perceptible to the user. The foregoing and other features, utilities and advantages of the invention will be apparent from the following more particular description of a preferred embodiment of the invention as illustrated in the accompany drawings.

DETAILED DESCRIPTION OF PREFERRED EMBODIMENTS

The preferred embodiment of the present operation operates in a mirrored write-back cache system, as described in the related applications cross-referenced above and incorporated herein by reference. To facilitate an understanding of the preferred embodiment of the invention, the mirrored write-back cache system is briefly described below under the subheading "Mirrored Write-Back Cache System." For a more complete understanding of this cache system, reference may be made to the cross-referenced related applications. The preferred embodiment of the additional logical operations in the present invention are described hereinafter under the subheading "Cache Module Warmswap."

Mirrored Write-Back Cache System

Figure 1:
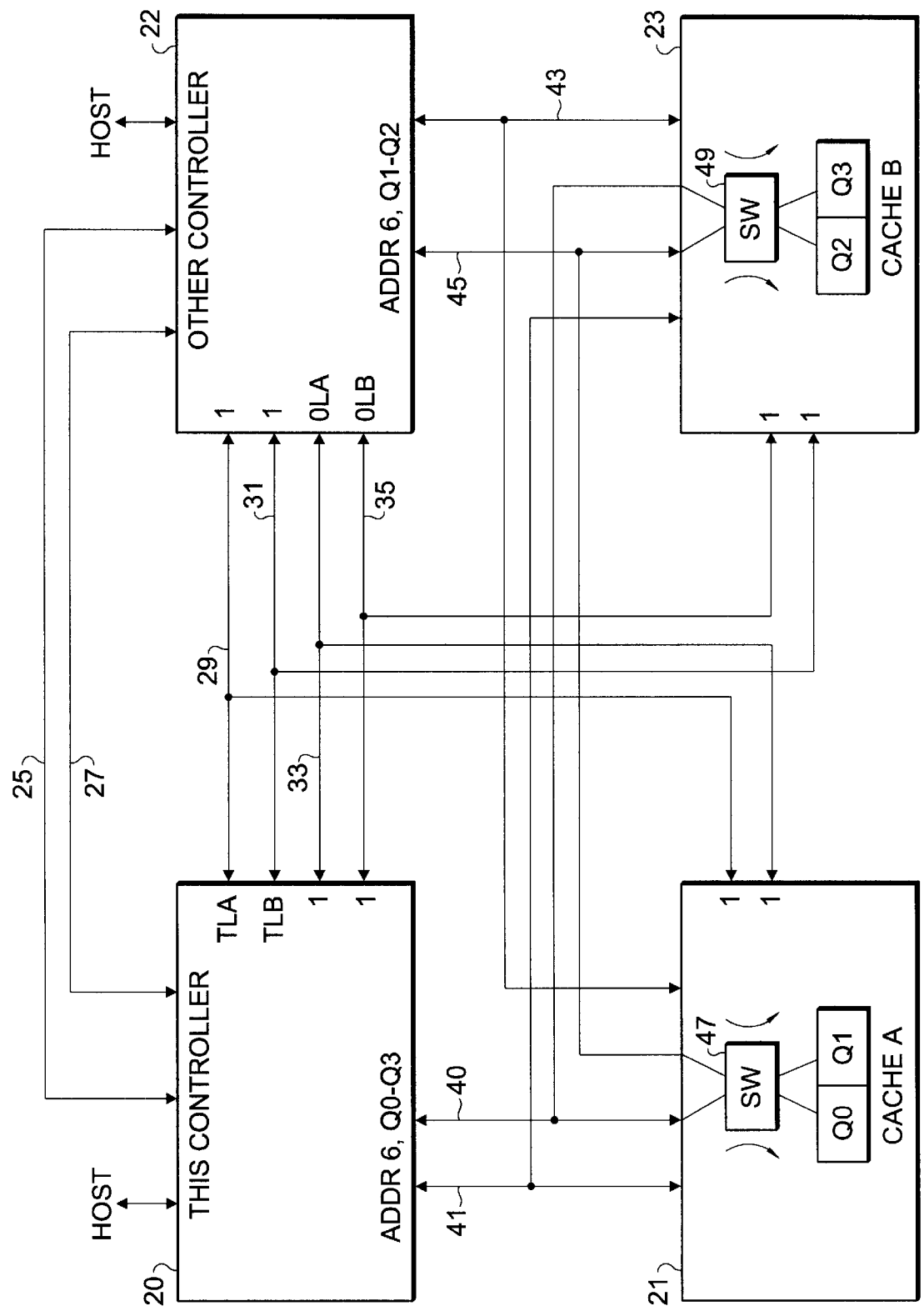
FIG. 1 shows a mirrored write-back cache system with dual controllers.

The configuration and operation of a mirrored write-back cache system, in which the preferred embodiment of the present invention operates, is illustrated in FIG. 1. FIG. 1 shows a mirror write operation with dual controllers. Controllers 20 and 22 and Cache A Module 21 and Cache B Module 23, along with the connections between each of these components are mirror images of each other. To help with the understanding of the operation of this dual controller cache system, controller 20 is referred to herein as "THIS" controller, and controller 22 is referred to as "OTHER" controller.

THIS controller 20 and OTHER controller 22 work with each other through a message link 25 and various control lines. Control Line 27 is a hard reset, or kill line, whereby either controller 20 or controller 22 may hard reset or kill the other controller. Control Lines 29, 31, 33, and 35 are lock lines that lock the operation of Cache A Module 21 and Cache B Module 23. Control Line 29 is the THIS Locks A (TLA) control line. This occurs when the signal on Control Line 29 is high, or in a binary 1 state. Similarly, Control Line 31 is the TLB line; i.e., THIS Locks B control line. Control Line 33 is the OLA, OTHER Locks A control line. Finally, Control Line 35 is the OLB or OTHER locks B control line. In a normal mirror write operation, all of these control lines 29, 31, 33, and 35 are high or in a binary 1 state, as indicated in FIG. 1.

There are also control lines between each of the controllers 20 and 22 and the Cache Modules 21 and 23. Control lines 41 pass requests, acknowledgment, read/write state and sync signals between THIS controller 20 and Cache A Module 21 and Cache B Module 23. Control lines 43 similarly pass request, acknowledge, read/write and sync signals between OTHER controller 22 and Cache A Module 21 and Cache B Module 23. Address data bus 40 passes the address and subsequently data words from THIS controller 20 to Cache A Module 21 and Cache B Module 23. Address data bus 45 similarly passes address and data words from OTHER controller 22 to Cache B Module 23 and Cache A Module 21.

In each of the Cache Modules, 21 and 23, there is a switch between the address/data buses 40 and 45 and the quadrants of the cache module. In Cache A Module 21, switch 47 directs address/data bus 40 to Quadrant Q0 and address/data bus 45 to Quadrant Q1. Switch 47 is controlled by the TLA and TLB lock signals. In the mirror write operation, both of these lock signals are high, or in a binary 1 state.

Switch 49 in Cache B Module 23 is also in a mirror write condition due to the binary 1 inputs from the OLA and the OLB control Lines 33 and 35. Accordingly, switch 49 connects address/data bus 45 to Quadrant Q2 and connects address/data bus 40 to Quadrant Q3.

In the normal operation for a mirror write in FIG. 1, THIS controller 20 is writing simultaneously to Quadrant Q0 of Cache A Module 21 and to Q3 of Cache B Module 23. Similarly, OTHER controller 22 in a mirror write operation is writing to Quadrant 1 of Cache A Module 21 and to Quadrant 2 of Cache B Module 23. In both THIS controller 20 and OTHER controller 22, the highest order address hexadecimal digit for this write operation is pre-determined to be a 6. Accordingly, an address of 6XXX XXXX to either the THIS controller or the OTHER controller is a signal to perform a mirror write. In the case of THIS controller, the mirror write is to Quadrants Q0 and Q3; in the case of OTHER controller, the mirror write is to Quadrants Q1 and Q2.

Cache Module Warmswap

As summarized earlier, one objective of the present invention is to provide for recovery of a mirror cache system, such as that shown in FIG. 1, from a cache module failure and to do so in a manner that degrades the performance of the mirror caches system minimally while the system is being repaired. When either cache A module 21 or cache B module 23 fails, THIS controller 20 and OTHER controller 22 will continue operating on the remaining one good copy of their data in the remaining good cache module. For example, if cache B module 23 fails, then THIS controller 20 works with its good data in quadrant Q0 of cache A module 21, and OTHER controller 22 works with its good data in quadrant Q1 of cache A module 21.

Figure 2:
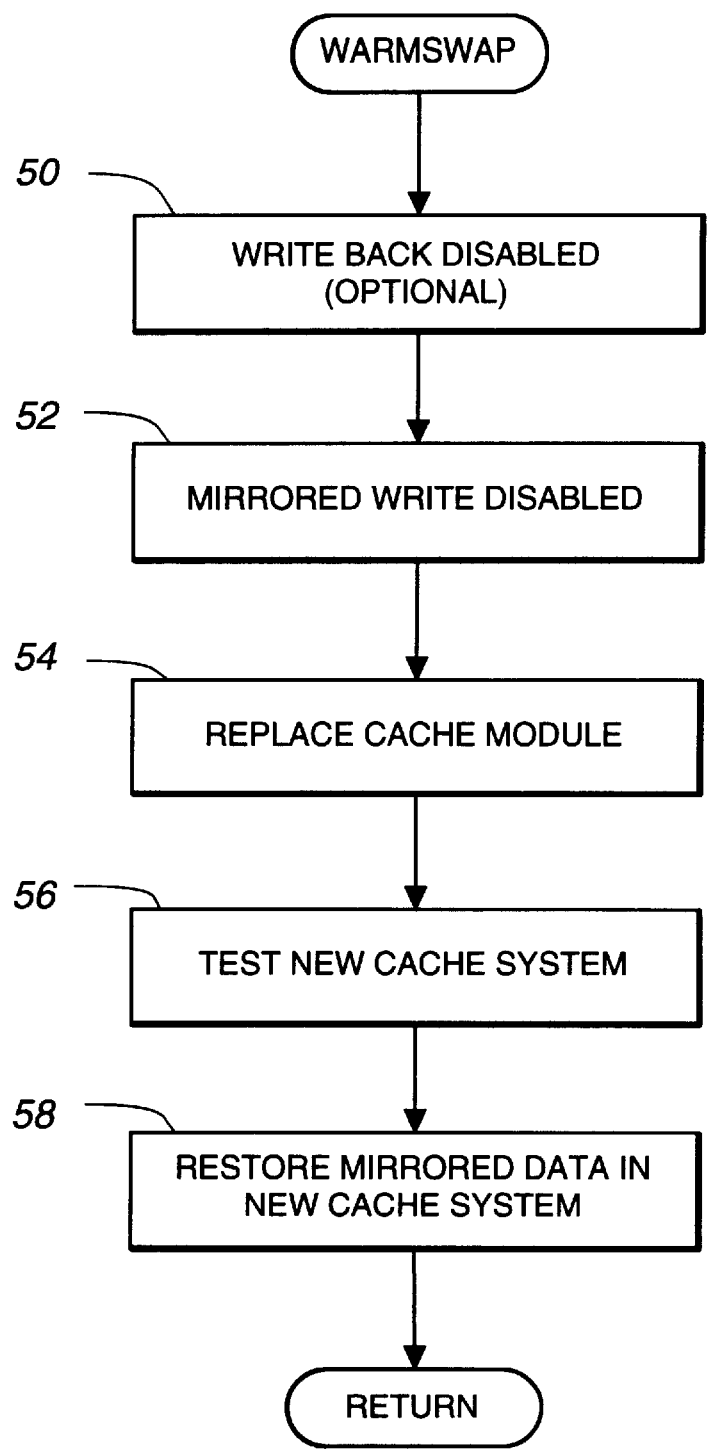
FIG. 2 shows the logical operations of a preferred embodiment of the invention for performing a cache module warmswap in the mirrored write-back cache system of FIG. 1.

A preferred embodiment for the warmswap operations of the present invention is shown in FIG. 2. The warmswap operations can be performed by a single controller, or they can be shared by both controllers. If both controllers are sharing the execution of the warmswap operations, the controllers must synchronize their operations.

When the user begins the warmswap, the first operation 50 in FIG. 2 is to disable the write-back operation of the mirrored write-back cache system. In effect, the cache system switches to a write-through operation where each time data is written to cache it is also written through to non-volatile storage. This effectively flushes all dirty data from the good cache module.

Dirty data is data in cache that has not been written to non-volatile storage. In write-back mode of operation, the data is not written to non-volatile storage until some future time. When both cache modules are operative, a duplicate copy of the dirty data exists in separate cache modules. The power to the cache system is backed up with batteries. The chance of both cache modules failing at the same time is extremely remote (mean time between cache failure is a trillion hours). Accordingly, the dirty data is as well protected in cache as it is in non-volatile storage.

During warmswap, the write-back disable operation 50 is optional. Even though there is only one good cache module, the user may still elect to continue in a write-back mode of operation. This will keep the cache system operating at a high-level of performance essentially unchanged from normal operation. The chance of the good cache module failing while the bad cache module is being replaced, is remote as discussed above. Therefore, the user has the option to maintain the performance level and accept a very low risk of losing data in the event the one good cache module goes down during warmswap. The most conservative approach is to disable write-back mode during warmswap.

In disable operation 52, the mirrored-write operation of the cache system is disabled. Since cache B module has failed in our example, a reliable copy of data can not be written in the cache B module. Therefore, mirrored-write operation is disabled. Now the cache B module is no longer in use and may be replaced. In operation 54, the cache B module is replaced with a new cache B module.

Test operation 56 performs diagnostic tests on the new cache module installed to replace the cache B module that failed. Test operation 56 validates, or confirms, correct operation of the new cache B module, specifically verifying functioning cache interface, memory control chips and good memory. The test also generates the lock signals to allow access for mirrored writes as described in the related applications cross-referenced above. Lastly, restore operation 58 restores the mirrored data in the new cache module, resyncs the controllers and enables mirrored-write. The mirrored write-back cache system is now repaired and the operations of the system are healed. The mirrored write-back cache system resumes full operation.

Figure 3:
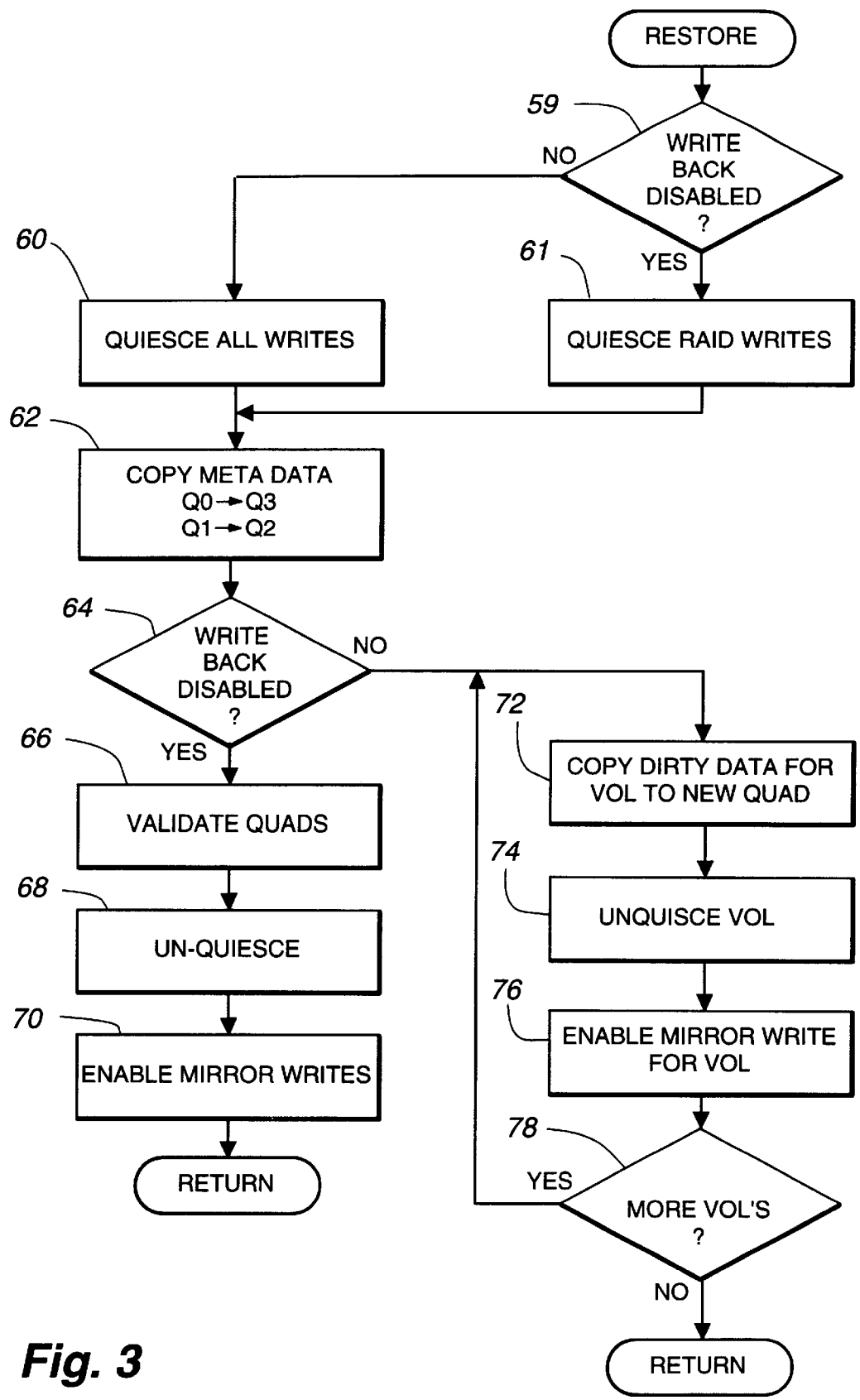
FIG. 3 shows the logical operations performed during the restore operation of FIG. 2.

In FIG. 3, the restore operation 58 of FIG. 2 is shown in detail. The restore operation begins at decision operation 59 which detects whether write-back is disabled. If write-back is not disabled, quiesce operation 60 quiesces all the write operations that could create dirty data in the good cache module (cache A). Write operations that could create dirty data include write operations with a RAID system or any write operations in write-back mode. If write-back mode was disabled, operation 61 quiesces only RAID write operations. The quiescing of write operation is done by telling the host to buffer, or hold, write operations momentarily while the new cache module is being restored.

Dirty data must be copied to the new module and thereby duplicated to protect it from loss. All dirty data is copied from the good module to the new module during the restore operation. Therefore, to minimize the amount of copying between cache modules during restore, write operations that create dirty data are put in a holding queue.

After the write operations are quiesced, copy operation 62 copies the metadata from the good cache module to the new cache module. In the present example where cache B module 23 was replaced with a new cache B module, metadata is copied from quadrant Q0 to quadrant Q3 by THIS controller 20, and metadata is copied from quadrant Q1 to quadrant Q2 by OTHER controller 22. The metadata is information block control data associated with the unwritten data in the cache modules.

Decision operation 64 detects whether write-back mode was disabled. If write-back was disabled, validate operation 66 declares the new quadrants in the new cache module as containing valid mirrored (identical) copies. Once "validated", the mirrored copies can be used for data recovery in the event of a future cache module failure. In validation, THIS controller 20 and OTHER controller 22 verifies the quadrants are ready and the controllers are synchronized. Operation 68 unquiesces the write operations quiesced by operation 61. Enable operation 70 enables mirror write operation. Warmswap is complete, the mirrored write-back cache system is healed and back to normal operation.

If decision operation 64 tests for write-back mode and finds it was not disabled, then the operation flow branches to copy operation 72. Copy operation copies the dirty data for a virtual volume (logical unit of stored date) from the good cache module to the new cache module. In our example, THIS controller copies the volume from quadrant Q0 to quadrant Q3 and OTHER controller copies the volume from quadrant Q1 to quadrant Q2. After the copying is complete for a volume, operation 74 un-quiesces writes to this volume in the cache system and operation 76 enables mirrored writing for this volume.

Decision operation 78 detects whether there are more volumes with dirty data to be copied to the new quadrants in the cache system. If there are more such volumes, the operation flow returns to copy operation 72 to copy the next volume. The copying, unquiescing, and mirrored-write enabling volume by volume continues until all dirty data has been copied into the appropriate new quadrant. In this manner, the new cache module is brought on-line volume by volume. Alternatively, all volumes with dirty data could be copied and then the entire cache system brought back on-line at one time. The advantage of performing these operations volume by volume is that some host write activity is allowed to resume quicker, and thereby minimize the momentary delay seen by the host. In any case after the last volume has been copied and mirrored-write enabled, decision operation 78 detects there are no more volumes to be copied. The restore operation and the warmswap operations are complete. The mirrored write-back cache system is healed and operating normally.

While a plurality of embodiments for implementing the invention have been described, it will be appreciated that any number of additional variations or alterations in the elements used to implement the invention may be made and are within the scope of the invention as claimed hereinafter.

What is claimed is:

1. A warmswap method for recovering full operation of a mirrored-write disk cache system, the cache system having at least a first and a second memory module and a writeback cache operation mode, the cache storing data to be written to at least one disk drive and metadata, the method used when one memory module of the first and second memory modules fails, the method comprising the steps of:

disabling mirrored write operations in the cache system such that the cache system performs write operations only to a non-failed memory module of the first and second memory modules;

replacing the memory module which has failed with a replacement memory module while continuing to perform the write operations to the non-failed memory module;

testing the replacement memory module in the cache system to confirm correct operation of the replacement memory module;

stopping write operations to the cache system;

determining a subset of data that comprises data that has not been written to the at least one disk drive and located in the non-failed memory module;

restoring the mirrored data in the cache system by copying the metadata, and the subset of data that comprises data that has not been written to the at least one disk drive, from the non-failed memory module to the replacement memory module;

resuming write operations to the cache system; and re-enabling mirrored write operations in the cache system.

2. The method of claim 1 wherein the step of stopping write operations comprises, for at least a portion of the cache, switching the cache from the writeback mode of operation to a writethrough mode of operation, and the step of resuming write operations for that portion of the cache comprises returning the cache to writeback operation.

3. The method of claim 1 wherein the step of disabling mirrored write operations for at least a portion of the cache is performed by holding write operations in a buffer.

4. The method of claim 3 wherein the portion of the cache having write operations disabled by holding write operations in the buffer comprises cache for RAID operations.

5. The method of claim 3, wherein the buffer is in a host computer system.

6. A warmswap method for recovering full operation of a mirrored-write disk cache system, the cache system having at least a first and a second memory module and a writeback cache operation mode, the cache storing data to be written to at least one disk drive and metadata, the method used when one memory module of the first and second memory modules fails, the method comprising the steps of:

disabling mirrored write operations in the cache system such that the cache system performs write operations only to a non-failed memory module of the first and second memory modules;

replacing the memory module which has failed with a replacement memory module while continuing to perform the write operations to the non-failed memory module;

testing the replacement memory module in the cache system to confirm correct operation of the replacement memory module;

stopping write operations to the cache system for a first and a second partition of the at least one disk drive;

restoring the mirrored data in the cache system by copying at least a portion of the metadata and a first portion of data from the non-failed memory module to the replacement memory module;

resuming write operations to the cache system for the first partition of the at least one disk drive;

re-enabling mirrored write operations in the cache system for writes directed to the first partition of the at least one disk drive;

restoring further mirrored data in the cache system by copying the second portion of data from the non-failed memory module to the replacement memory module;

resuming write operations to the cache system for the second partition of the at least one disk drive; and re-enabling mirrored write operations in the cache system for writes directed to the second partition of the at least one disk drive.

7. The method of claim 6 wherein the step of stopping write operations comprises, for at least a portion of the cache, switching the cache from the writeback mode of operation to a writethrough mode of operation, and the step of resuming write operations for that portion of the cache comprises returning the cache to writeback operation.

8. The method of claim 6 wherein the step of disabling mirrored write operations for at least a portion of the cache is performed by holding write operations in a buffer in a host computer.

9. The method of claim 8 wherein the portion of the cache having write operations disable by holding write operations in the buffer in the host computer comprises cache for RAID operations.

10. In a mirrored, write-back, cache system, a method for replacing a failed cache memory module and recovering the cache system while continuing to operate the cache system using a good cache module, said cache system having two cache modules and two controllers, each cache module having two quadrants of storage space so that a mirrored write operation writes the same data to one quadrant in one cache module and a paired quadrant in the other cache module, said method comprising the steps of:

disabling write-back operations and enabling write-through operations for the cache system;

disabling the mirrored write operations and enabling writing to only the good cache module during recovery of the system;

replacing the failed cache module with a new cache module while continuing to write to the remaining good cache module;

testing the new cache module in the cache system to confirm correct operation of the new cache module; and restoring the mirrored write operations to both the remaining good cache module and the new cache module.

11. The method of claim 10 wherein said restore operation comprises the steps of:

quiescing RAID write operations to prevent writing to the cache system data that is not backed-up;

copying metadata from both quadrants in the good cache module to paired quadrants in the new cache module;

verifying all quadrants are operating correctly and the controllers are synchronized;

enabling write-back and RAID write operations; and enabling mirrored-write operations to the cache system.

* * * * *